(12) United States Patent
Schulz et al.

(10) Patent No.: US 6,333,090 B1
(45) Date of Patent: Dec. 25, 2001

(54) CERAMIC HEAT-INSULATING LAYERS WITH CLUB-STRUCTURE

(75) Inventors: Uwe Schulz, Troisdorf; Claus-Jürgen Kröder, St. Augustin; Jörg Brien, Wuppertal; Hartmut Schurmann, Neunkirchen; Klaus Fritscher, Köln, all of (DE)

(73) Assignee: DLR Deutsches Zentrum fur Luft-Und Raumfahrt E.V. (DE)

( * ) Notice: Subject to any disclaimer, the term of this patent is extended or adjusted under 35 U.S.C. 154(b) by 0 days.

(21) Appl. No.: 09/521,189

(22) Filed: Mar. 7, 2000

Related U.S. Application Data

(62) Division of application No. 09/058,228, filed on Apr. 10, 1998, now Pat. No. 6,063,435.

(51) Int. Cl.$^7$ ................ B32B 3/02; B32B 7/00; B32B 3/00; C25D 11/02; C03C 27/02
(52) U.S. Cl. ................ 428/92; 428/119; 428/144; 428/210; 428/629; 428/632; 428/633; 428/655; 428/660
(58) Field of Search ................ 428/92, 119, 632, 428/629, 633, 655, 144, 210, 660

(56) References Cited

U.S. PATENT DOCUMENTS

| | | |
|---|---|---|
| 4,321,310 | 3/1982 | Ulion et al. ................ 428/612 |
| 5,087,477 | 2/1992 | Giggins, Jr. et al. ................ 427/38 |
| 5,350,599 | 9/1994 | Rigney et al. ................ 427/255.7 |
| 5,514,482 | 5/1996 | Strangman ................ 428/623 |

OTHER PUBLICATIONS

M. Schmucker et al., "Haftmechanismen in ausgewahlten EB–PVD–Warmedammschichtsystemen", Fortschrittsberichte der Deutschen Keramischen Gesellschaft, 10 (1995) 4, pp. 379–384.

Rigney, et al., "PVD Thermal Barrier Coating Applications and Process Development for Aircraft Engines", NASA conference publication, 3312 (1995), pp. 135–149.

B.A. Movchan et a., "Study of the Structure and Properties of Thick Vacuum Condensates of Nickel, Titanium, Tungsten, Aluminum Oxide and Zirconium Dioxide", Fiz. metal. metalloved., 28, (1969) pp. 83–90.

U. Schulz, Wachstum, Mikrostruktur und Lebensdauer von elektronenstrahlaufgedampften Warmedammschicht–Systemen fur Turbinenschaufeln,Shaker Publishers, Aachen, Germany (1995), pp. 1–133.

*Primary Examiner*—Blaine Copenheaver
*Assistant Examiner*—Hai Vo
(74) *Attorney, Agent, or Firm*—Brobeck, Phleger & Harrison, L.L.P.

(57) ABSTRACT

The present invention relates to a process for vapor-depositing zirconium dioxide on ceramic or metallic substrates, and the heat-insulating layers obtainable by such process.

14 Claims, 5 Drawing Sheets

SCANNING ELECTRON MICROGRAPH

BASIC SKETCH

CERAMIC HEAT-INSULATING LAYERS WITH CLUB-STRUCTURE

Figure 1:
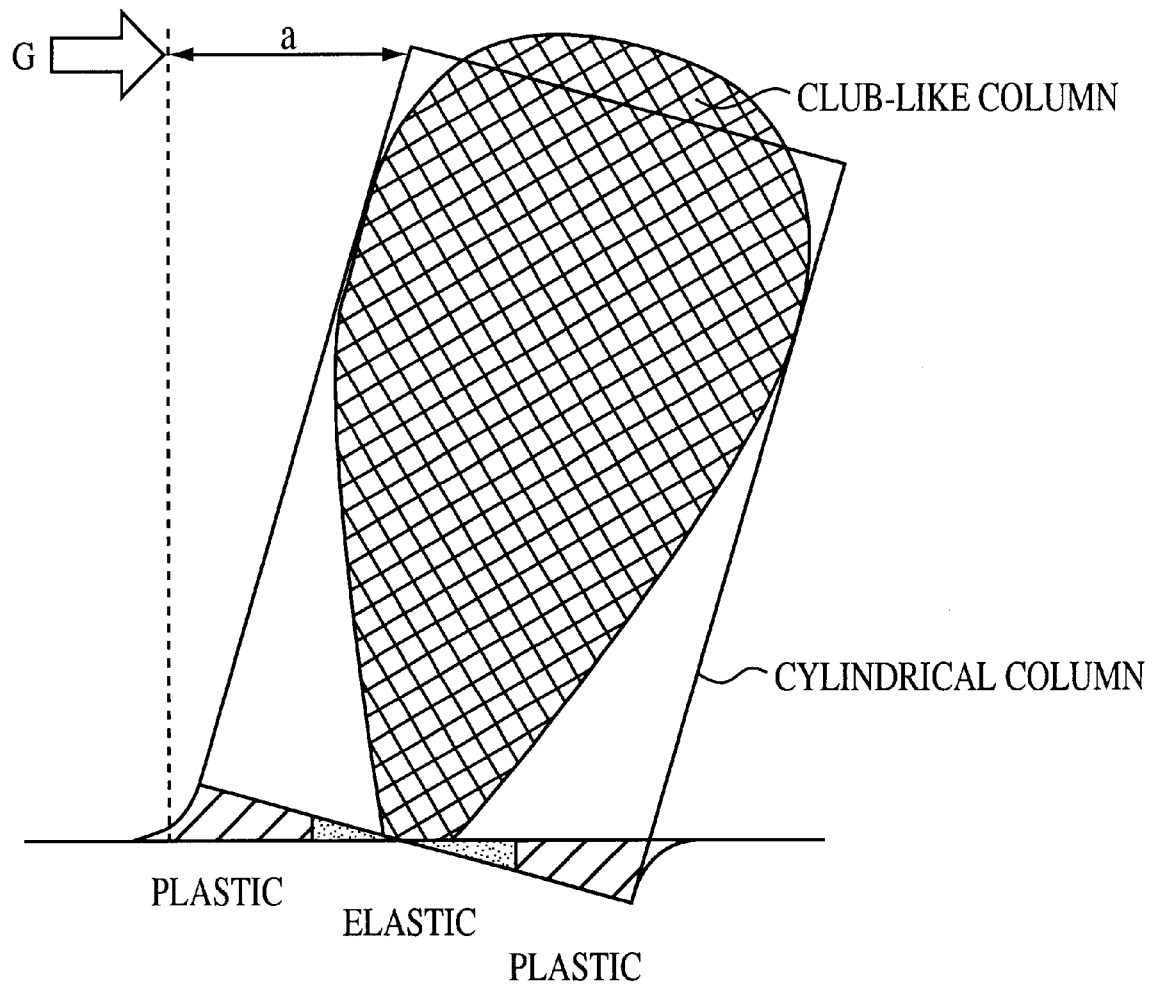

This application is a divisional application of U.S. patent application Ser. No. 09/058,228, filed Apr. 10, 1998, now U.S. Pat. No. 6,063,435.

Ceramic Heat-Insulating Layers with Club-Structure

The present invention relates to a process for vapor-depositing zirconium dioxide on ceramic or metallic substrates, and the heat-insulating layers obtainable by such process.

A wide variety of ceramic heat-insulating layers for high-temperature applications, for example, on gas turbine components, which are prepared by electron-beam evaporation, preferably of zirconium dioxide having a columnar microstructure, have already been described and protected. The prior art comprises the three essential elements of such electron-beam vapor-deposited heat-insulating layer systems, consisting of a metallic substrate which can form a dense alumina layer (corundum) by oxidation, the alumina layer itself, and a discontinuous ceramic heat-insulating layer having a characteristic columnar structure which allows for the accomodation of lateral expansions of the substrate. Such expansions may arise from the different thermal expansions of the substrate and ceramic heat-insulating layer, or may be caused by elastic or plastic deformations in the substrate, and by external actions (e.g., particle erosion). The functionality of these layers is retained if, in addition to sufficient adhesion, the spaces between the columns which serve the function of expansion gaps are retained. Therefore, the latter must not be disturbed or even removed by sinter bridges or large upsets of the substrate.

The condensation of vapor particles on a solid substrate occurs in three partial steps:
- loose binding of the condensating atoms and radicals as so-called "adatoms" with relatively high mobility along the surface;
- diffusion of the adatoms to reach a low-energy site on the surface during their lives, or re-evaporation in the case of a vain search for such a site;
- bulk diffusion of incorporated adatoms into the final atomic union to form crystal nuclei, and growth thereof to give crystal columns.

Now, the more the melting point of the substance and the substrate temperature during the vapor-depositing process approach, the greater is the mobility of the atoms, and the denser the growing layers thereby become. Depending on the homologous temperature of the layer substances, different characteristic layer structures are generated. These layer structures have been described many times. The best-known is the three-zone-structural model by B. A. Movchan et al., "Study of the structure and properties of thick vacuum condensates of nickel, titanium, tungsten, aluminium oxide and zirconium dioxide", Fiz. Met. Metalloved. 28 (1969), p. 83–90. In zone 1, at homologous temperatures, $T_s$, of up to about 0.26 (for oxides, and up to 0.3 for metals), there are formed very thin acicular discontinuous crystallites with a high defect density. In this form, they are unsuitable for high thermal and mechanical stresses. As already mentioned for the $ZrO_2$ growth of the heat-insulating layers, zone 2 ($T_s$ of up to 0.45) is characterized by predominating surface diffusion. The layers grow to contain continuous columns, the thicker stems growing at higher temperatures. Between the stems, there are points of contact as well as gaps which confer a certain pseudo-plasticity to the layers. However, the free volume of the gaps decreases as the temperature is increased. Above 0.45 $T_s$, bulk diffusion predominates, resulting in dense structures.

Now, if the substrate is continuously rotated during the layer growth in the temperature range of predominating surface diffusion, for example, in order to provide it with an all-around coating, these layer structures are subjected to another modification of their shapes. Due to more effective growth selection mechanisms, the stem structure is driven to adopt a coarser shape and is thus imprinted a <001> texture. As a rule, the <110> direction or <100> direction is in the direction of the rotational axis, irrespective of a left-handed or right-handed sense of rotation. Repeated reversal has no marked influence, either. The stem diameters do not only become thicker through increasing temperatures, but the stems may similarly be rendered coarser by increasing the rotational speed as demonstrated in studies by U. Schulz, "Wachstum, Mikrostruktur und Lebensdauer von elektronenstrahlaufgedampften Wärmedämmschicht-Systemen für Turbinenschaufeln, Shaker Publishers, Aachen, Germany (1995), p. 1–133.

For example, the actually observed layer structures in heat-insulating layers of zirconium oxides exhibit mostly parallel stem structures in a fine design if vapor-deposition has taken place in the stationary mode at about 0.4 $T_s$. Mostly parallel stem structures, although in a coarse design, occur upon rotation at considerably increased temperatures, e.g., when 0.55 $T_s$ and 12 rpm, or 0.46 $T_s$ and 30 rpm is achieved. At essentially lower temperatures/rotational speeds (for example, 0.4 $T_s$ and 12 rpm), branched lean stems will occur which do not extend through the entire thickness of the layer. In a medium range (e.g., 0.4 $T_s$ and 30 rpm, or 0.46 $T_s$ and 12 rpm), growth selection mechanisms will greatly prevail which will give rise to many thin stems at the beginning of the layer growth, with a drastical reduction of the number thereof in the further coarse of growth, and growth of the diameter of the remaining stems. This gives rise to a conical and in part slightly club-like structure, especially with those columns which have continuously grown from the base to the surface. The thin necks of the clubs adhere to the substrate. The great majority of the columns grown from nulcei in the adhesion region will not reach the surface of the layer, but terminate growth in an early or medium stage.

On a commercial scale, the adjustment of the desired layer structures is achieved by a well-aimed control of the main parameters: substrate temperature, total gas pressure in the vapor-depositing vessel, as well as oxygen partial pressure and rotational speed of the substrates during the coating process, as reported by Rigney et al., "PVD thermal barrier applications and process development for aircraft engines", NASA conference publication, 3312 (1995), p. 135–149, and U.S. Pat. No. 5,350,599. Prior to coating, the surface condition of the samples is one of the decisive criterions for the adhesion and formation of the layer structures.

An improvement of the adhesion of the heat-insulating layer by a particularly even design (polishing) of the metallic substrate is described in U.S. Pat. No. 4,321,310. On this surface, a thin corundum layer is produced by thermal oxidation prior to coating which has a similarly even design as the subtrate. On top of it, heat-insulating layer is vapor-deposited which. must have a vertical orientation of the stems in accordance with the patent. Of course, on even substrates consisting exclusively of corundum, a well-adhering heat-insulating layer can also be applied by direct electron-beam physical vapor deposition on corundum, as shown by studies by Schmücker et al., "Haft-mechanismen in ausgewäahlten EB-PVD-Wäarmedämmschichtsystemen", Fortschrittsberichte der Deutschen Keramischen Gesellschaft, 10 (1995), 4, p. 379–384.

The roughness of the substrate surface initiates the formation of differently ordered and disturbed layer structures, as shown by Rigney et al. (loc. cit.). That is, in the reverse case, parallel growth of the stems is promoted by a very even (polished) surface. However, the disturbances of the columns which may be useful, for example, under stress-geometric aspects, are detrimental to adhesion since they are bought at the expense of a greatly interlocked Me/MeO intermediate layer which functions as the source of additional exalted stress in the adhesion region under alternating heat stresses. This favors premature breakage failure within the ceramic layer near the Me/MeO transition. Thus, a certain amount of roughness must not be exceeded at this critical place for the sake of a good adhesion.

U.S. Pat. No. 5,087,477 describes a process for the coating of metallic substrates, such as gas turbine blades made of Ni-based super-alloys, with oxide-ceramic heat-insulating layers of stoichiometric $ZrO_2.Y_2O_3$ by electron-beam physical vapor deposition in the presence of oxygen while the substrate is rotated around the substrate axis. The layers exhibit a columnar structure characteristic of this process.

Therefore, it has been the essential object of the present invention to provide the critical Me/MeO adhesion surface with an optimum small roughness, and to provide the heat-insulating layer deposited thereon with an optimum layer structure which can be adjusted independently of the roughness of the substrate layer.

The above object is achieved with the features of claim 1. Further embodiments can be seen from the dependent claims.

The invention is based on the fact that from a mechanical, stress-geometric and thermodynamic point of view, the columnar microstructure of the vapor-deposited heat-insulating layers of zirconium dioxide which has currently been recommended and used does not yet represent the optimum. It is based on the idea that more favorable structures can be achieved in view of service life, damage course and high-temperature resistance.

Corresponding structural elements are developed. Also, under process engineering aspects, it has been proven that layers with the corresponding structural elements can be realized purposefully by electron-beam physical vapor deposition.

In the operation of, for instance, turbine blades with heat-insulating layers, relative motions occur, as mentioned above, between substrate and heat-insulating layer from elongation stresses. However, these motions must not necessarily be exclusively lateral, i.e. perpendicular to the columnar structure, as usually discussed in the prior art. The motion may also be influenced by tilting and lever moments. Mechanistic considerations show that such moments also lead to transversal stress components. This situation is illustrated in a simplified basic sketch in FIG. 1.

FIG. 1 shows the deformation behavior of the metallic adhesion zone of a column under a tilting stress, especially one (individual) column whose base is attached to the underlying substrate and alumina layer by (chemical) adhesion. If a force G is laterally applied to this column in the head region, the column is tilted there by a distance a. For beams clamped at bottom, the laws of beam bending mechanics say that the highest stress is found in the bottom of the beam. This is where failure of the beam is most likely to occur. This case can be transferred to that of a column. It is assumed that adhesion between base and substrate layer is completely maintained, even when the head of the column is shifted by a distance a. Depending on the modulus of elasticity and the yield point of the materials concerned, this flexural moment leads to a more or less high strain in the root. Parts of the root are elastically strained, but at higher temperatures; the outer regions, in particular, of the root are also increasingly deformed plastically. At the given column geometry, fatigue phenomena of the material and a thereby caused detachment of the column or layer are to be anticipated under an applied mechanical alternating stress of ±G.

However, if a changed geometry of the club type according to the invention is assumed instead of the column geometry with parallel orientation, the tapered end of the club representing the base, and the club. is shifted by the same distance a, as outlined in FIG. 1, then the root base entirely remains in the elastic region. Thus, fatigue phenomena of the material do not occur.

Figure 2:
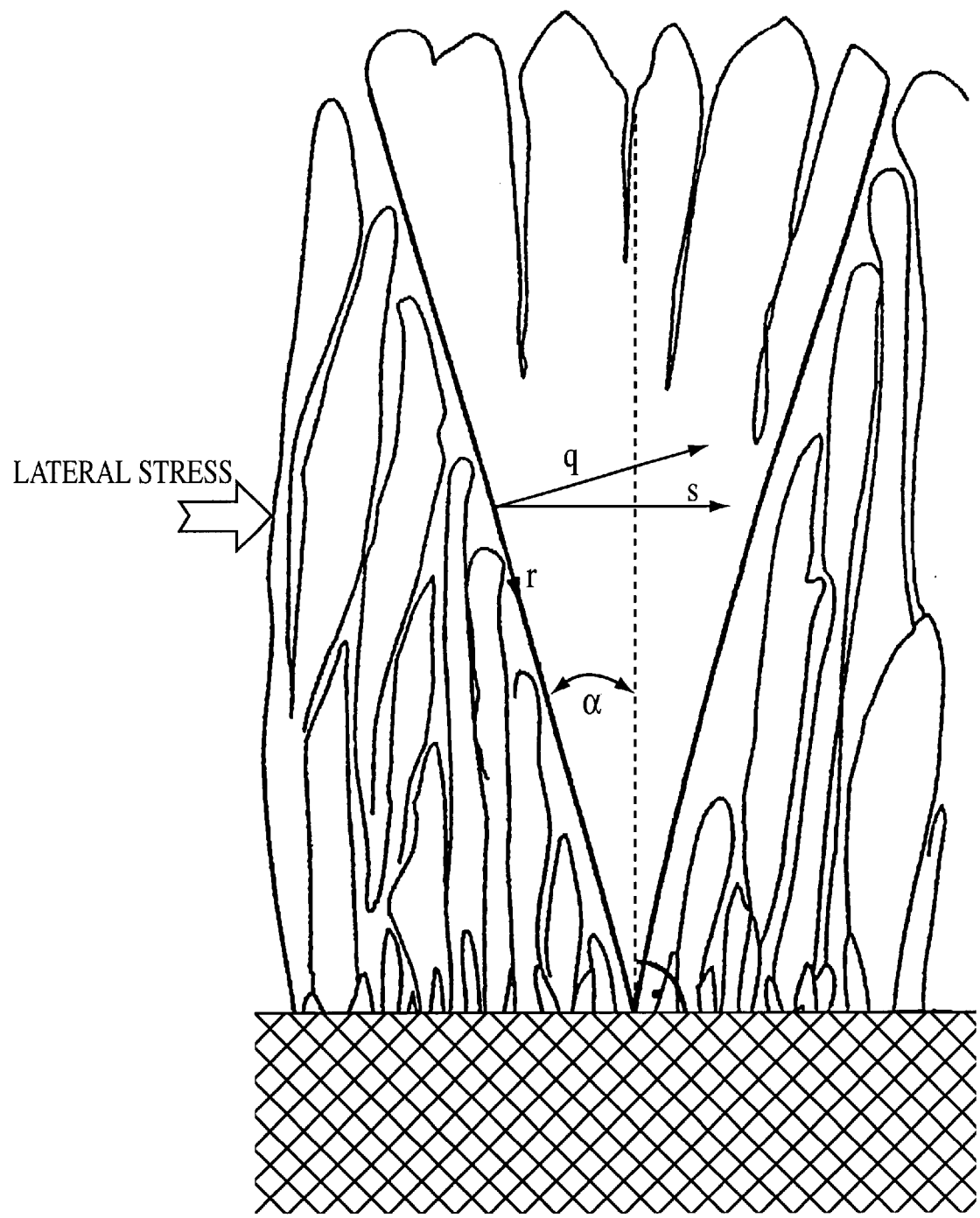

FIG. 2 shows the division of a lateral stress, s, into two smaller transversal stress components, q and r, on a club-like column, which proves that the club structures are particularly advantageous even if lateral stresses are applied. According to the value of the angle of the conical limitation, $\alpha$, the stress vector, s, can be divided into two- vector components, r and q, r being related to the energy-dissipating friction. This beneficial term becomes the larger, relatively, the larger the angle value, $\alpha$, of the conical limitation can be adjusted. That is, the larger the apex angle, $\alpha$, of the club, the more effective is the stress reduction which can be achieved by conversion to heat energy by friction.

The club structure can be purposefully adjusted and enhanced by the process according to the invention. Beginnings of the basic pattern of club geometry can already be seen from the known structural diagram according to Movchan et al. (loc. cit.) which has been established, however, on resting, i.e. non-rotating, substrates. In the experiments according to the invention, it was shown that the rotational speed, $\omega$, of the substrates during the coating process is of prominent importance to the formation of a partially club- and bell-shaped or saffron-like geometry. The optimum range for achieving such a structure can be limited by the following two mathematical equations:

$$T = \frac{2428}{\omega^{0.153127}} \quad \text{(a)}$$

$$T = \frac{1756}{\omega^{0.153127}} \quad \text{(b)}$$

where T represents the substrate temperature in °K, and $\omega$ represents the rotational speed of the substrate in rpm, wherein the rotational speed is varied continuously or discontinuously, or alternatively in alternating senses of rotation.

This temperature band is particularly suitable, according to the invention, for imprinting a coarse striation to the layer in its base, region, and for producing continuous club-like crystal columns and bent, entwined leaner neighboring columns, wherein these features are caused or enhanced by a corresponding control of the rotational speed. The minimum rotational speed at the beginning and the maximum rotational speed preferably differ by a factor of two or more.

In our own experiments, rapid changes of the rotational speed from fast to slow or from slow to fast were performed. They showed that the layer will immediately adopt a structure in accordance with the current condensation conditions. Thus, various structural changes can be brought about through the speed parameter. In contrast, the integral density (i.e. the geometrically determinable density which results from the density of the ceramic columns and the intermediate porosity in the form of expansion gaps) of the heat-insulating layer does not or not essentially change upon changing the rotational speed, as was also shown by our own experiments. Thus, in comparative experiments, the following densities were determined in the production of 250 μm thick layers on identical round rods having a diameter of 7 mm, wherein only the axial rotational speed thereof was changed while all other parameters, such as gas pressures, substrate temperature and vapor depositing rate, were kept constant:

| rotational speed | 10 rpm | 27 rpm |
|---|---|---|
| geometrical density | 4.84 g · cm$^{-3}$ | 4.86 g · cm$^{-3}$ |

The average size of the upper column diameters, in turn, can be strongly influenced by the rotational speed, as has been known in the prior art. Due to the density's being constant, the size of the expansion gap is influenced in the same way as the column diameter: as the rotational speed increases, both the column diameter and the size of the expansion gap increase. Thus, in layers which contain highly conical columnar elements with thin base regions, it is to be anticipated that the width of the expansion gaps will increase in the outward direction. This is another aspect which is advantageous for the pseudo-plasticity of the ceramic layers and thus important.

A slow rotational speed promotes the formation of many short, branched crystal stems, i.e. the nucleation rate is particularly high. High temperatures will again reduce this effect. From this point of view, for achieving, a high density of nuclei, it is useful to perform the nucleation phase both at low rotational speeds and at low temperatures, outside the ranges given by equations (a) and (b). During the nucleation phase, up to about 25% of the total layer thickness is produced. "Lower temperatures" herein means the range of temperatures which is below those which result in the formation of highly conical structural elements and a club-like structure.

In a preferred embodiment of the present invention, the rotation of the substrate is not kept constant in the course of the process, but it is changed from minimum to maximum rotational speeds. It is particularly preferred if the ratio of maximum rotational speed to minimum rotational speed is at least 2.

The process according to the invention is particularly useful for the preparation of stem structures which grow coarser in the outward direction and have an upper stem diameter of from 10 to 100 μm.

Another possible variation of the process according to the invention is to reduce the power effectively introduced in the system, for example, to keep constant or reduce the substrate temperature during the process. Thus, when the substrate temperature is to be decreased during the process, wherein any temperature decrease may be chosen, it is preferred to adjust it predominantly by reducing the power of the electron beam gun, by switching off/inactivating one or more of the guns or targets in multi-crucible evaporation by activating a cold wall or cold plate in the evaporation recipient, by introducing a radiation screen to absorb the radiation power emitted by the melting bath, by increasing the active space inside the evaporation recipient, by switching off an additional heater or increasing the distance between the substrate and evaporation bath.

According to the process of the invention, it is preferred to first remain in the range of column formation for directing growth with a club structure, and then to continue at the same temperatures, but at higher rotational speeds. This transition may be continuous or abrupt. The nucleation may well occur below the temperature band for the club formation.

After the process according to the invention, it is possible to anneal at higher temperatures within or above the range of club formation.

Figure 3:
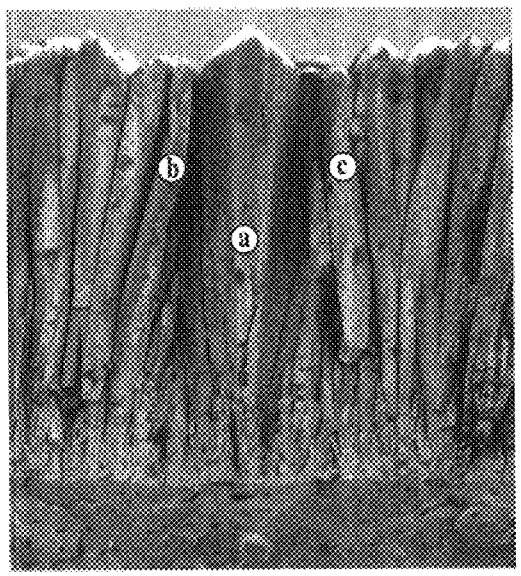

FIG. 3 shows the structure of a 250 μm thick layer which has been prepared according to the specific manner of the invention, exhibiting the pronounced structural elements which deviate from the columnar shape, as a scanning-electron micro-photograph of a fracture from which the spatial arrangement of the structure can be seen more easily.

Figure 4:
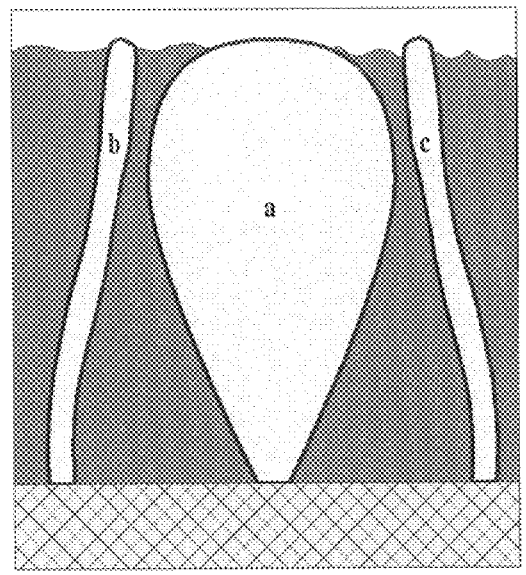

FIG. 4 renders a basic sketch of the scanning image obtained according to FIG. 3. Both Figures show the club-like column a which is surrounded by S-shaped lean neighboring columns b and C.

Figure 5:
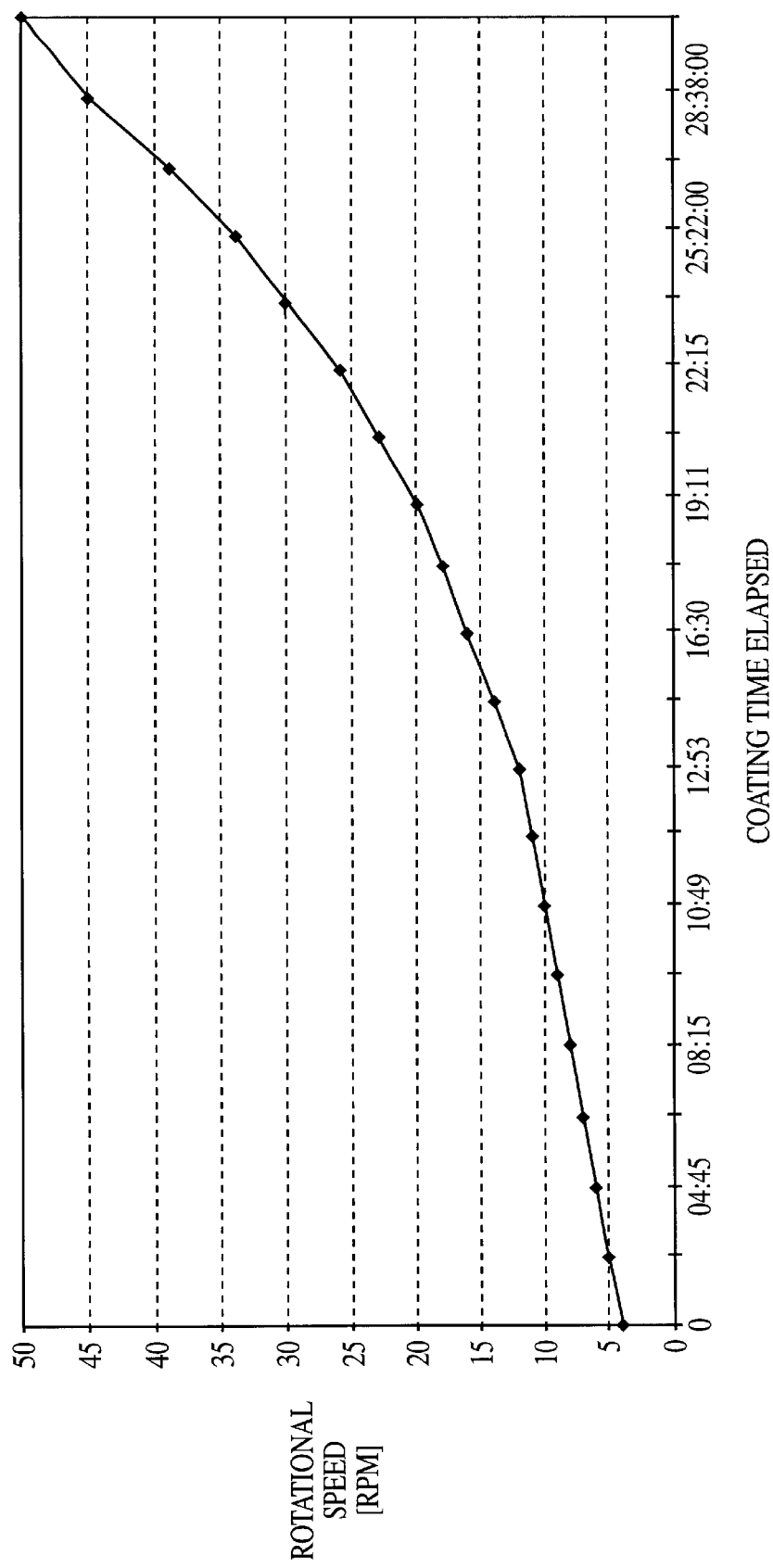

The layer was coated as follows to a substrate having a roughness as low as $R_a$=2 μm:

The substrate was heated to 980° C. and then coated at 960 to 980° C. while rotating. The nucleation phase was started with 4 rpm, and then the rotational speed was continuously increased to 50 rpm within 30 minutes. FIG. 5 shows the related course of the speed chosen during the vapor deposition process. Thus, about 25% of the total layer thickness were deposited at the beginning below the "club band". Thus, the structure achieved is characterized by a high nucleation rate in the base region. Vapor deposition was subsequently performed within the "club band" where, the layer growth is controlled by the conditions of a more restricted growth selection. On one hand, it leads to the formation, of bulged, club-like columns (the value of the angle of the conical limitation, α, of individual crystallites is from 15 to 20°, as shown in FIG. 2), and on the other hand, it leads to a bent and entwined growth (S-shaped) of the leaner neighboring columns which is imposed thereon by the dominating club-shaped columns having larger diameters, as can be seen from FIG. 3 and FIG. 4. The occurrence of this structural component was surprising and unforeseeable, but is important from a mechanical point of view. It is just the close neighborhood between them and the bulged columns which results in a cushioning of the actions of lateral stresses, as if they represented a buffer of layer material having a reduced modulus of elasticity.

Figure 6:
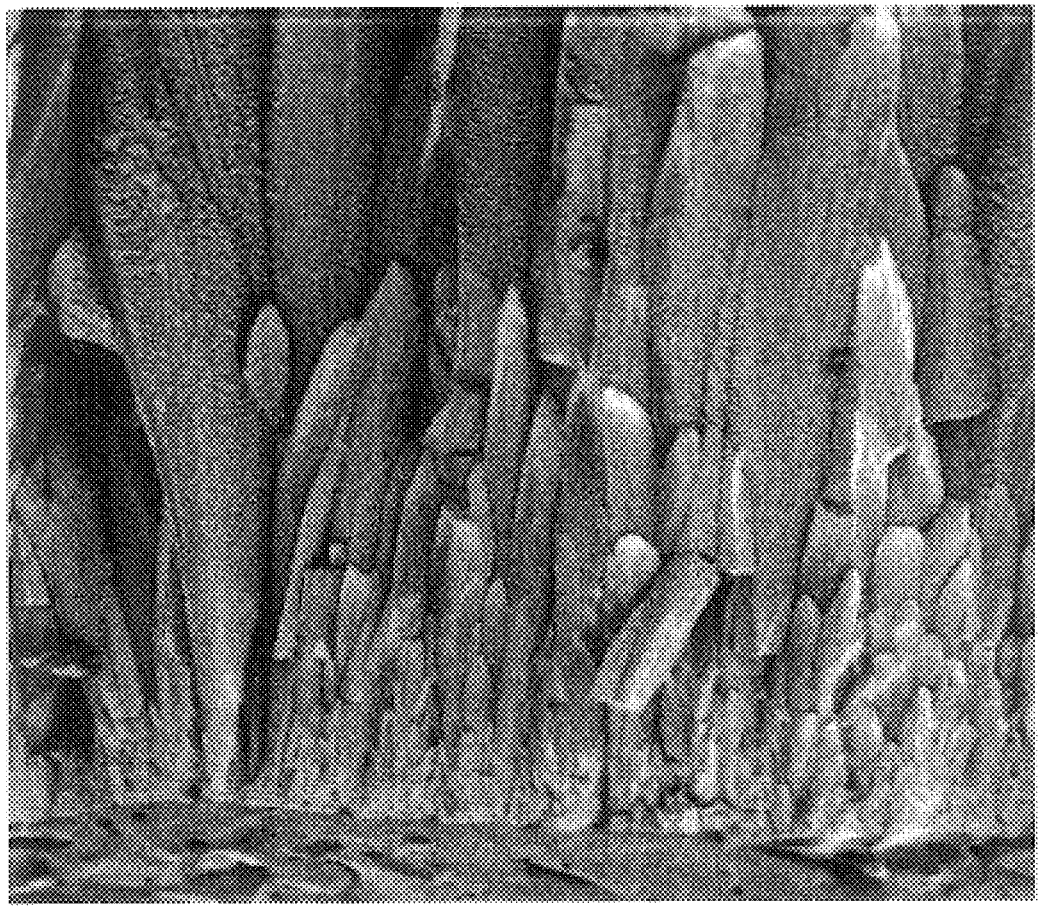

The variable process control becomes visible in the enlarged details in FIG. 6 (ZRO2#8) where a saw-tooth-like coating of about 1.5 μm per layer has been formed in the base region, generated by the slow revolution during the starting phase, one additional layer per revolution. This striation which is characteristic of the base region of these structure-specific layers becomes increasingly finer in the course of the further layer growth due to the continuous increase of the rotational speed, and thus becomes less clearly perceptible.

The essential regions of the structures achieved with the procedure according to the invention may be summarized with statements of the functionality achieved:

The base region is characterized by
  its coarse striation;
  intensive nucleation (for achieving a high density of nuclei by adjusting a slow rotational motion and optionally, in addition, by selecting a temperature below the temperature band with optimum suitability for the formation of conical structural elements);
  chemical adhesion by the bonding of the ceramic layer which has been achieved;
  mechanical interlocking with neighboring crystallites due to the coarse saw-tooth profile (striation) on both sides which provides additional support, in particular, for the thick, heavy club-like crystals;

elastomechanically acting transition between substrate and heat-insulating layer.

The intermediate region is characterized by conical structural elements with a large apex angle and reduced striation, as well as bent-entwined leaner neighboring columns which serve as an absorption zone for part of the lateral stresses through conversion thereof to heat by friction (at the club flanks); and a zone of reduced modulus of elasticity (through S-shaped structural elements).

The head region is characterized by particularly large diameters of the crystal columns which are particularly resistant to the thermodynamic restraint of sintering due to the large diameters and relatively large expansion gaps.

The claimed structural components are to be considered structural specialties, and can be grown as a crystal shape in a well-aimed manner. It has been shown that these structural components offer advantages in mechanistic, stress-geometric and thermodynamic terms. In addition, a way is shown for the well-aimed generation of such structural components irrespective of the roughness of the substrate, solely through the special kind of process control in electron-beam physical vapor deposition.

Thus, another embodiment of the present invention comprises ceramic heat-insulating layers of zirconium dioxide, optionally doped with rare-earth metal oxides or mixtures of such oxides, especially $Y_2O_3$, $CeO_2$, $Sc_2O_3$, $Yb_2O_3$ or mixtures thereof, which have a club-like structure and are obtainable by the process according to the invention.

It is particularly preferred, according to the invention, to use the process for the coating of turbine blades.

What is claimed is:

1. A ceramic heat-insulating layer for a ceramic or metallic substrate, the layer comprising a plurality of club shaped columns which coat the substrate, wherein the columns comprise zirconium dioxide.

2. The ceramic heat-insulating layer of claim 1, wherein the zirconium dioxide is doped with rare-earth metal oxides or mixtures of such oxides.

3. The ceramic heat-insulating layer of claim 1, wherein the club shaped columns are attached to the substrate at their tapered end.

4. The ceramic heat-insulating layer of claim 1, wherein the club shaped columns are attached to a base coating of zirconium dioxide at their tapered end.

5. The ceramic heat-insulating layer of claim 1, wherein the club shaped columns comprise about 25% total thickness of the column at their tapered end.

6. The ceramic heat-insulating layer of claim 1, wherein the club shaped columns have an upper stem diameter of from 10 to 100 82 m.

7. The ceramic heat-insulating layer of claim 1, wherein the layer further comprises a plurality of S-shaped columns.

8. The ceramic heat-insulating layer of claim 7, wherein the S-shaped columns have smaller diameters than the club shaped columns.

9. The ceramic heat-insulating layer of claim 1, wherein the ceramic or metal substrate is a turbine blade.

10. A heat-insulating layer for a ceramic or metallic substrate, the layer comprising a plurality of club shaped columns which coat the substrate, wherein the layer is formed by a process of vapor-depositing zirconium dioxide, optionally doped with rare-earth metal oxides or mixtures of such oxides, on a ceramic or metallic substrate.

11. The heat-insulating layer of claim 10, wherein the substrate is subjected to temperatures ranging from 873K to 1823K and is rotated at a rotational speed ranging from 1 to 300 rpm, and wherein the substrate is coated with zirconium dioxide during a nucleation phase, and is subsequently coated with additional zirconium dioxide during a coating phase, the coating phase comprising:

rotating the substrate at a temperature and rotational speed wherein the temperature of the substrate and rotational speed of the substrate, are within a range defined by the equations:

$$T = \frac{2428}{\omega^{0.153127}} \quad (a)$$

$$T = \frac{1756}{\omega^{0.153127}} \quad (b)$$

to manipulate deposit characteristics, where T represents the substrate temperature in K, and $\omega$ represents the rotational speed of the substrate in rpm, wherein the rotational speed is varied continuously or discontinuously, or alternatively in alternating senses of rotation, and the rotational speed during the coating phase is faster than the rotational speed during the nucleation phase.

12. The heat-insulating layer of claim 11, wherein the rotational speed of the substrate, $\omega$, is changed during the coating phase by increasing the speed from a first rotational speed to a second rotational speed.

13. The heat-insulating layer of claim 12, wherein the ratio of said second rotational speed to said first rotational speed is at least 2.

14. The heat-insulating layer of claim 10, wherein the ceramic or metal substrate is a turbine blade.

* * * * *